United States Patent
Chen

(10) Patent No.: US 7,646,202 B2
(45) Date of Patent: Jan. 12, 2010

(54) STATIC MEASURING METHOD OF ELECTRICAL REFERENCES OF THREE-PHASE PERMANENT MAGNET SYNCHRONOUS MOTOR

(75) Inventor: Ming-Tsung Chen, Taoyuan Shien (TW)

(73) Assignee: Delta Electronics, Inc., Taoyuan Shien (TW)

( * ) Notice: Subject to any disclaimer, the term of this patent is extended or adjusted under 35 U.S.C. 154(b) by 40 days.

(21) Appl. No.: 11/957,722

(22) Filed: Dec. 17, 2007

(65) Prior Publication Data

US 2009/0157336 A1 Jun. 18, 2009

(51) Int. Cl.
*G01R 31/08* (2006.01)

(52) U.S. Cl. ........................ 324/525; 324/522

(58) Field of Classification Search .......... 324/522, 324/525
See application file for complete search history.

(56) References Cited

U.S. PATENT DOCUMENTS 7,339,344 B2 * 3/2008 Borisavljevic .......... 318/723

2006/0055362 A1 * 3/2006 Tobari et al. .......... 318/716

* cited by examiner

*Primary Examiner*—Amy He
(74) *Attorney, Agent, or Firm*—Chun-Ming Shih

(57) ABSTRACT

A method for measuring a resistance and an inductance of a permanent magnet synchronous motor (PMSM) in a static state includes inputting a rated current of the PMSM and 150% of the rated current at a state of locking an axle of the PMSM, recording corresponding voltages $V_{100}\%$ and $V_{150}\%$, and dividing the voltage difference with the current difference to obtain the resistance of the PMSM. The method continues dividing an electrical period into six voltage vectors, and performing four voltage cycles for every the voltage vector. The voltage cycle includes step of outputting a quarter of the voltage $V_{150}\%$, and outputting the voltage $V_{150}\%$ after the current being stable. After one of the six voltage vectors being finished, the method switches to the other voltage vectors and repeats the voltage cycles, and the method is completed till all of the six voltage vectors being finished. Finally, the method continues to compare rising times of the voltage vectors and convert the rising times to inductances, and to define the maximum of the inductances as an inductance of a q axis and to define the minimum of the inductances as an inductance of a d axis.

7 Claims, 3 Drawing Sheets

(A)

(B)

`US 7,646,202 B2`

STATIC MEASURING METHOD OF ELECTRICAL REFERENCES OF THREE-PHASE PERMANENT MAGNET SYNCHRONOUS MOTOR

BACKGROUND OF THE INVENTION

1. Field of the Invention

The present invention relates to three-phase permanent magnet synchronous motors, and more specifically, to measuring electrical references of the three-phase permanent magnet synchronous motors.

2. Description of the Related Art

With development of science and technology, motors have been developed enough. Specially, after permanent magnet stones with high energy coming out, permanent magnet motors with high efficiency are implemented, and motors are more widely utilized. Essential electrical references of motors, such as resistance and inductance, are representations of essential performances of the motors, and thus, acquiring the exact essential references is needed to efficiently control and apply the motors. However, a current measuring method of electrical references of the three-phase permanent magnet synchronous motor uses an original motor to drive the measuring motor, that is, the measuring motor is in a generator mode, and the measuring method adds a load at the output end of the measuring motor. When the original motor runs steadily, the measuring method obtains a voltage and a current of the output end of the measuring motor by a short test to compute the resistance and the inductance of the measuring motor. The current measuring method needs various devices, and the measuring motor is needed to run, and thus, noises will be produced. Therefore, the current measuring method is inconvenient.

What is needed is a measuring method of electrical references of the three-phase permanent magnet synchronous motor, which can solve the above problem.

BRIEF SUMMARY

One object of the invention is providing a static measuring method of electrical references of a three-phase permanent magnet synchronous motor, which can measure the electrical references of the motor at a static state, and the measuring motor does not need to run. Therefore, the static measuring method can solve unnecessary noises.

Another object of the invention is providing a static measuring method of electrical references of a three-phase permanent magnet synchronous motor, which does not need miscellaneous devices, and can simplify the measuring process and reduce the measuring cost.

To obtain the above objects, the invention locks a rotation axis of the measuring motor by a mechanical brake so that the motor is not rotating. The method includes inputting a rated current of the PMSM and 150% of the rated current at a state of locking an axle of the PMSM, recording corresponding voltage V100% and V150%, and dividing the voltage differecne with the current differnce to obtain the resistance of the PMSM. The method continues dividing an electrical period into six voltage vectors at a state of vector controlling, and performing four voltage cycles under every the voltage vector. The voltage cycle includes step outputting a quarter of the voltage V150%, and outputting the voltage V150% after the current being stable. After one of the six voltage vector being finished, the method switches the other voltage vector and repeats the voltage cycles, and the method is completed till all of the six voltage vectors being finished. Finally, the method continues to compare rising times of the voltage vectors and convert the rising times to inductances, and to define the maximum of the inductances as an inductance of a q axis and to define the minimum of the inductances as an inductance of a d axis.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

Reference will now be made to the drawings to describe a preferred embodiment of the present in-mould molding touch module, in detail.

Figure 1:
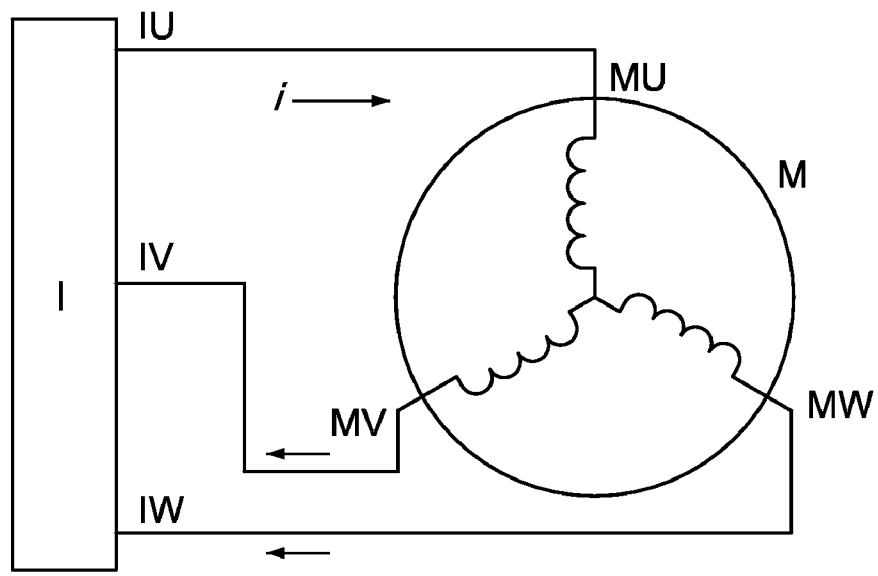
FIG. 1 is a schematic, structural-view of a system of measuring a resistance of a measuring motor, in accordance with a preferred embodiment of the present invention.
Figure 2:
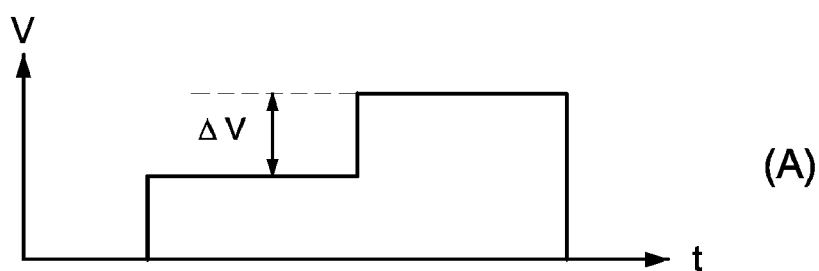
FIG. 2 is a schematic, relationship view of a voltage and a current when measuring the resistance of the measuring motor.
Figure 2:
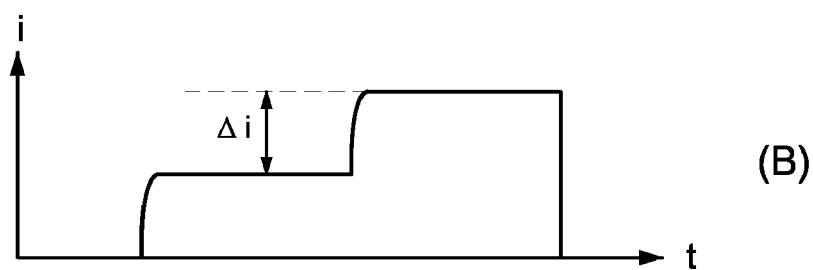
Figure 5:
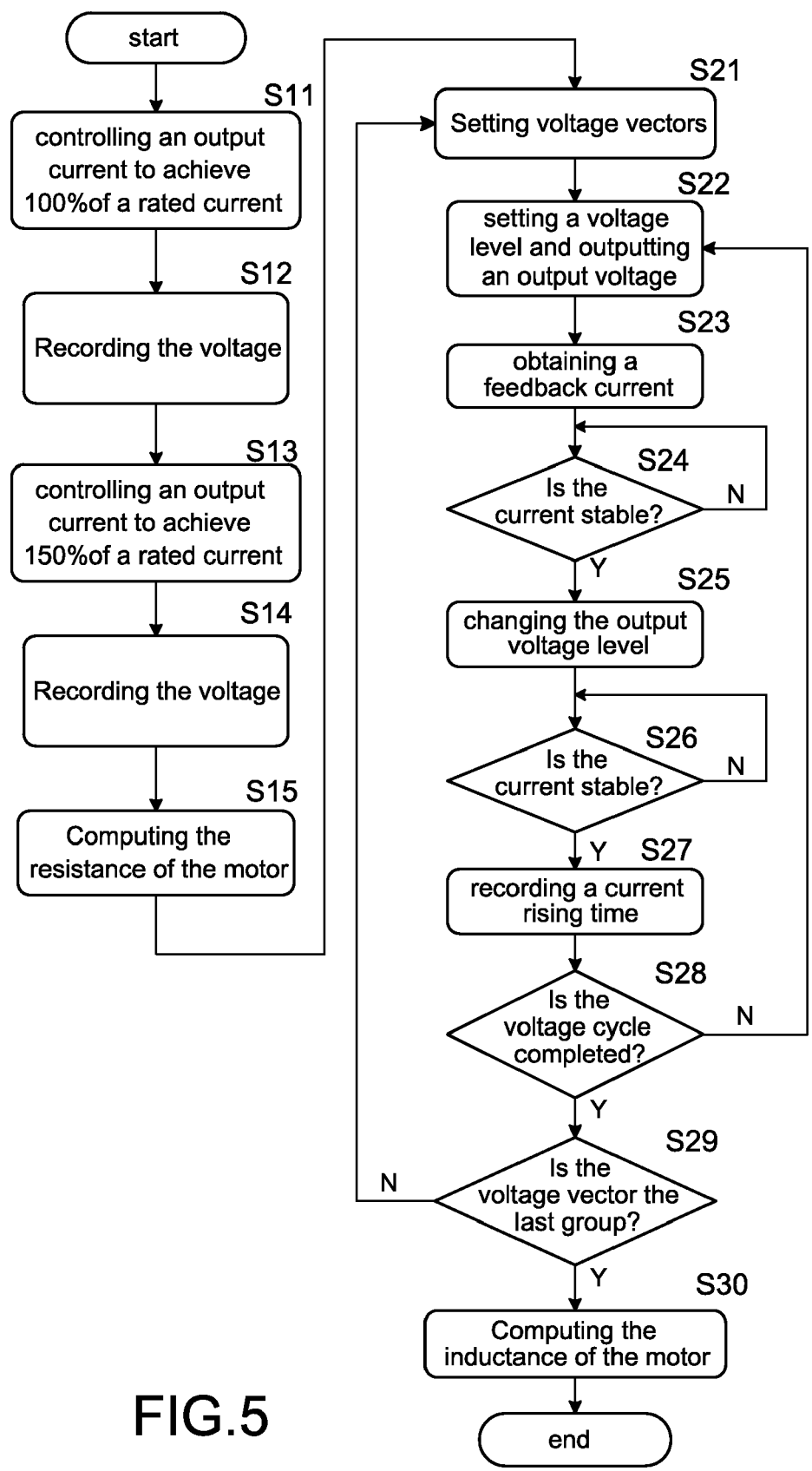
FIG. 5 is a schematic, flow chart of a measuring method of electrical references of the measuring motor, in accordance with an embodiment of the present invention.

The basic references of a motor mainly include a resistance and an inductance of the motor. The measuring method of the invention includes two stages, wherein a first stage is measuring the resistance of the motor, and the second stage is measuring the inductance of the motor. FIG. 1 is a schematic, structural-view of a system of measuring a resistance of a measuring motor, in accordance with a preferred embodiment of the present invention. A three-phase permanent magnet synchronous motor (PMSM) M includes three voltage input ends MU, MV, and MW. The three voltage input ends MU, MV, and MW are connected with output ends IU, IV, IW of a transducer I respectively. The measuring method controls an output voltage of the transducer I to achieve a direct current (DC) voltage input function, and locks a rotation axis of the measuring motor M by a mechanical brake so that the measuring motor is M not rotating. Referring to FIG. 5, the left part of FIG. 5 shows the measuring process of the resistance of the measuring motor M. Firstly, the measuring process controls the transducer I to output a step voltage into the measuring motor M. The step voltage is shown as FIG. 2A. Raising the voltage and Inspecting the current state, when the current of the measuring motor M achieves 100% ($I_{100\%}$) of a rated current of the measuring motor M, the measuring process pauses to raise the voltage (S11), and records an input voltage ($V_{100\%}$) at the time(S12). After recording the input voltage ($V_{100\%}$), the measuring process continues to raise the voltage and inspect the current state. When the current of the measuring motor M achieves 150% ($I_{150\%}$) of the rated current, the measuring process pauses to raise the voltage again (S13), and records an input voltage at that time (V150%) (S14). FIG. 2B shows a state of the current changing with the voltage. The resistance can be obtained from the voltage and the current by using the Ohm Law, that is:

$$Rs = \frac{V_{150\%} - V_{100\%}}{I_{150\%} - I_{100\%}}$$

wherein the Rs is the resistance of the measuring motor M. The first stage for measuring the resistance of the measuring motor M is completed.

Figure 3:
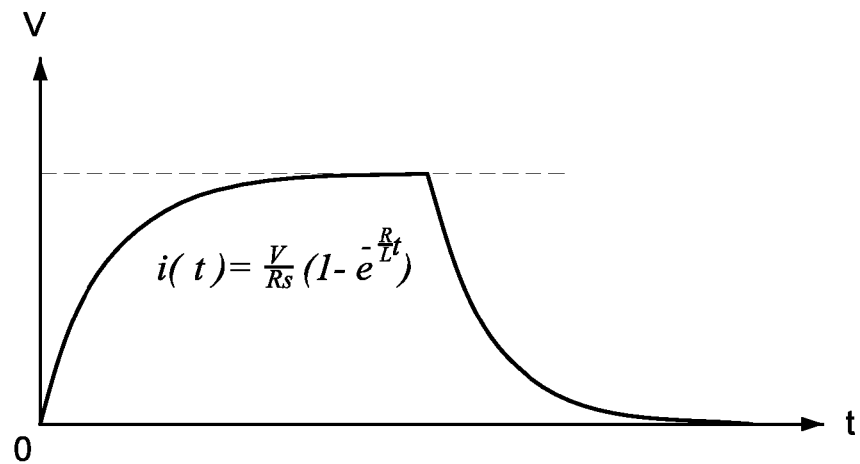
FIG. 3 is a schematic, relationship view of the voltage and the current of the measuring motor in a transient state.

FIG. 3 is a schematic, relationship view of the voltage and the current of the measuring motor in a transient state. When inputting the step voltage into the measuring motor M, a current response curve is a function of the resistance and the inductance, and thus, under the condition of the resistance of the measuring motor M being known, the inductance of the measuring motor M can be obtained by a relationship of the voltage and the current.

Figure 4:
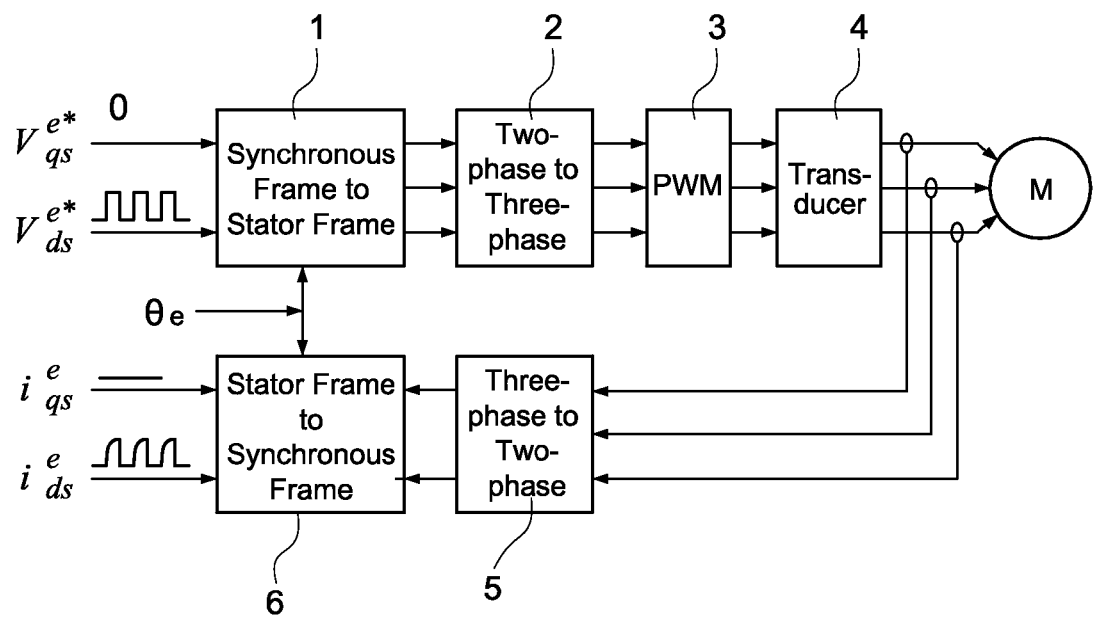
FIG. 4 is a schematic, structural-view of a system of measuring an inductance of the measuring motor, in accordance with another preferred embodiment of the present invention.

FIG. 4 is a schematic, structural-view of a system of measuring an inductance of the measuring motor, in accordance with another preferred embodiment of the present invention. Voltages of a d axis and a q axis are transmitted by a synchronous frame to stator frame 1, and then through a two-phase to three-phase 2. Successively, the voltages pass through a pulse wavelength modulation (PWM) 3 and a transducer 4, and then input into the measuring motor M. Whereafter, the measuring method takes the current from the measuring motor and transmits the current through a three-phase to two phase 5, and then through a stator frame to synchronous frame 6. Finally, the measuring method outputs currents of the d axis and the q axis.

The measuring of the inductance uses electrical performances cooperating with vectors control to measure the inductance of the measuring motor M in the state of locking the motor M by the mechanical brake. For the synchronous axes d and q math mode of the three-phase PMSM, when the output frequency is zero, the two axes voltage equation can be simplified as:

$$V_{qs}^{e} = (Rs + L_q \cdot p) \cdot i_{qs}^{e}$$

$$V_{ds}^{e} = (Rs + L_d \cdot p) \cdot i_{ds}^{e}$$

wherein the p is a differential coefficient, the current response corresponding to any one axis voltage inputting as a step voltage should be:

$$i(t) = \frac{V}{R_S}\left(1 - e^{-\frac{R_S}{L_x}t}\right) \quad (a)$$

wherein the $$\frac{V}{R_S}$$

is a current response in a stable stage, the $R_S$ is the resistance of the motor M, and the $L_x$ is an inductance of the d and q axes. The current response includes the inductance reference. When the equation of $$-\frac{R_S}{L_x}t = -1$$

is satisfied, the equation (a) can be rewritten as:

$$i(t) = \frac{V}{R_S}(1 - e^{-1}) = 0.632 \cdot \frac{V}{R_S} \quad (b)$$

According to the equation (b), when the current rising to 0.632 multiple of the stable value, the relationship of the inductance and the resistance can be rewritten as:

$$L_x = t_{0.632} \cdot R_S$$

wherein the $t_{0.632}$ is the time of the current rising to 0.632 multiple of the stable value.

Because of locking the motor M, any one of the d and q axes can be taken as a voltage command output axis, and another axis maintains the voltage command being zero. The measuring method divides an electrical period into a plurality of electrical angles, and outputs two groups of voltage commands in sequence at every electrical angle. The motor M will produce a current transient response because of the voltage difference. The measuring method measures the feedback current and transfers the d and q coordinate axes, and then records the rising time of the feedback current. According to the rising time of the feedback current and the resistance Rs, the corresponding inductance can be obtained. Therefore, the inductance of the motor M can be obtained at the condition of the motor M not rotating.

As described in the above, the invention provides a measuring method of the inductance of the motor M, as shown in the right part of FIG. 5. After obtaining the resistance of the motor M, the measuring method divides the electrical period into six different voltage vectors under vectors control (S21) and selects one of the six voltage vectors. In theory, the electrical period is divided into more voltage vectors, and the obtained corresponding electrical references are more exact. Considering the measuring time, the six voltage vectors are preferable.

Successively, the measuring method performs a voltage cycle corresponding to each of the six voltage vectors. The voltage cycle includes firstly outputting a quarter of the voltage $V_{150\%}$ as a step voltage (S22), obtaining the feedback current (S23), changing the voltage level to the voltage $V_{150\%}$ (S25) after the feedback current being stable (S24Y), starting to time, stopping timing after the feedback current being stable again (S26Y), and recording the time of the current rising time after changing the voltage (S27). The steps from S22 to S27 are one voltage cycle, and the measuring method performs four times of the voltage cycle corresponding to each of the six voltage vectors. The aforementioned low voltage can avoid waveform distortion influenced by dead time of driving a power element to switch upper and lower branches short. Though the motor M is locked by the mechanical brake, the motor M may rotate little when the measuring method performs a first time of the voltage cycle under every voltage vector to cause distortion of the rising current. Therefore, regarding each of the voltage vectors, the feedback current of the first time of the voltage cycle being not used. Furthermore, regarding each of the voltage vectors, a feedback current comparing level is established during the second time of the voltage cycle, and the measuring method computes a course time of the feedback current achieving 0.632 multiple of a stable value in the third and fourth times of the voltage cycle, wherein the rising time is obtained by averaging the course times of the third and fourth times.

Whereafter, the measuring method continues switching the other one of the six voltage vectors, and repeating the steps from S21 to S28 till completing performing all of the six voltage vector. Finally, the measuring method continues to compare rising times of the voltage vectors and to convert the rising times to inductances (S30), and to define the maximum of the inductances as an inductance of a q axis and to define the minimum of the inductances as an inductance of a d axis. The measuring of the inductance of the motor M is completed.

The above description is given by way of example, and not limitation. Given the above disclosure, one skilled in the art could devise variations that are within the scope and spirit of the invention disclosed herein, including configurations ways of the recessed portions and materials and/or designs of the attaching structures. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. A static measuring method of electrical references of a three-phase permanent magnet synchronous motor (PMSM), comprising:
   a) applying a voltage to the PMSM by a transducer;
   b) controlling an output current of the PMSM to achieve 100% of a rated current of the PMSM;
   c) recording a first voltage;
   d) controlling the output current to achieve 150% of the rated current of the PMSM;
   e) recording a second voltage;
   f) computing a resistance of the PMSM by the difference of the first voltage and the second voltage and the difference of the 100% and 150% of the rated current of the PMSM;
   g) setting a plurality of output voltage vectors, and selecting one of the output voltage vectors;
   h) performing a voltage cycle, the voltage cycle comprising:
      h1) setting a voltage level, and outputting an output voltage;
      h2) obtaining a feedback current;
      h3) changing the voltage level after the feedback current being stable;
      h4) obtaining the stable feedback current;
      h5) recording a rising time of the feedback current after the feedback current being stable;
   i) switching the other one of the output voltage vectors, and repeating the steps from g to h till completing all of the output voltage vectors; and
   j) using the rising time and the resistance of the PMSM to compute an inductance of the PMSM.

2. The measuring method as claimed in claim 1, wherein the step g divides the electrical period of the PMSM into six voltage vectors.

3. The measuring method as claimed in claim 1, wherein the step h performs four times of the voltage cycle.

4. The measuring method as claimed in claim 3, wherein regarding each of the voltage vectors, the feedback current of the first time of the voltage cycle being not used, a feedback current comparing level is established during the second time of the voltage cycle, and the measuring method computes a course time of the feedback current achieving a predetermined multiple of a stable value in the third and fourth times of the voltage cycle, wherein the rising time is obtained by averaging the course times of the third and fourth times.

5. The measuring method as claimed in claim 4, wherein the predetermined multiple is 0.632.

6. The measuring method as claimed in claim 4, wherein the output voltage is a step output voltage, wherein the output voltage is a quarter of a voltage $V_{150}$% corresponding to 150% of the rated current at a first time of performing the step h1 during every time of the voltage cycle, and the output voltage changes to the voltage $V_{150}$% at a second time of performing the step h1 during every time of the voltage cycle.

7. The measuring method as claimed in claim 1, wherein the step j defines the maximum of the inductances of the PMSM as an inductance of a q axis ($L_q$), and defines the minimum of the inductances of the PMSM as an inductance of a d axis ($L_d$).

* * * * *